United States Patent [19]
Wang

[11] Patent Number: 5,959,504
[45] Date of Patent: Sep. 28, 1999

[54] VOLTAGE CONTROLLED OSCILLATOR (VCO) CMOS CIRCUIT

[76] Inventor: Hongmo Wang, 126 Ridge Rd., Watchung, N.J. 07060

[21] Appl. No.: 09/037,337

[22] Filed: Mar. 10, 1998

[51] Int. Cl.[6] ............................... H03B 5/12; H03B 7/02
[52] U.S. Cl. .............................. 331/117 FE; 331/177 R; 331/115; 331/132; 333/217
[58] Field of Search ........................ 331/34, 36 C, 331/115, 117 FE, 117 R, 117 D, 132, 177 R, 177 V; 333/217

[56] References Cited

FOREIGN PATENT DOCUMENTS 0204583  11/1983  Germany ................. 333/217

*Primary Examiner*—David Mis

[57] ABSTRACT

A voltage controlled oscillator (VCO) CMOS circuit wherein back gate terminals of CMOS transistors are used to vary the parasitic capacitances of the transistors. The back gate terminals receive a signal from a variable voltage source so that oscillation can be controlled by adjusting the variable voltage. The CMOS transistors are connected across an inductor and the transconductance characteristics of the transistors reduce the resistance of the inductor, thereby improving circuit oscillation and providing enhanced stability and capabilities at high operating frequencies.

7 Claims, 5 Drawing Sheets

VOLTAGE CONTROLLED OSCILLATOR (VCO) CMOS CIRCUIT

BACKGROUND OF THE INVENTION

I. Field of the Invention

The present invention relates to a voltage controlled oscillator (VCO) circuit constructed in CMOS. More particularly, the present invention pertains to a CMOS VCO circuit wherein back gate CMOS terminals are employed for VCO tuning.

II. Description of Related Art

Oscillator circuits are well known and are employed in numerous applications. There are two primary types of VCO circuits; a relaxation type which employs a resistor-capacitor (RC) constant, and a resonant type which employs a tunable inductor-capacitor (LC) tank circuit. For high frequency applications, resonant tank circuits are preferred due to the frequency accuracy and reduced phase noise they exhibit, their stability and, perhaps most importantly, their high frequency capabilities.

Resonant oscillator circuits are formed from a parallel configuration of an inductance (L) and a capacitance (C). Under ideal conditions, such a parallel L-C arrangement will oscillate in perpetuity. However, due to resistance losses resulting from, inter alia, the inductance, the oscillation properties resemble an RLC circuit and result in a damping oscillation. Such an R-L-C circuit is shown in the prior art circuit of FIG. 1, wherein R represents the resistance losses in the circuit caused by the inductor L and capacitor C.

To eliminate the damping effect, the effect of resistance losses R must be cancelled, as for example shown in the circuit of FIG. 1b wherein a transconductance element (denoted as -R) is placed in parallel with the inductive losses R to cancel out the resistance. The equivalent schematic representation of FIG. 1b is shown in FIG. 1c wherein capacitor C is replaced by its equivalent, i.e. a pair of capacitors having equal value (2C). For tunability, the capacitors are replaced with variable capacitors, as seen in FIG. 1d.

As is known in the art, for VCO frequency stability the product of the L and C values must remain at a high constant value with a relatively large value inductor L used in combination with a small value capacitor. A large L is used for providing a robust oscillator i.e. to provide for ease in initiating oscillation of the circuit. It should, therefore, be recognized that if components having undesirably large parasitic capacitance values are used, then for a given LC value a lower value inductor will be required to compensate for the increased capacitance. A problem arises in VCO CMOS design because existing techniques for generating a transconductance element -R to compensate for the LC resistance loss results in relatively high parasitic capacitance. For example, and as shown in FIG. 2a, a CMOS N-channel transistor pair is employed to produce a transconductance effect. The circuit equivalent of FIG. 2a is shown in FIG. 2b wherein the CMOS transistor pair satisfactorily provides the transconductance element -R to compensate for the resistance loss inherent in the inductor. Such use of a CMOS transistor pair also undesirably produces an unwanted parasitic capacitance C' which, when incorporated in the circuit of FIG. 1d, results in the circuit of FIG. 3 wherein an N-channel CMOS pair and a P-channel CMOS pair are employed in a push-pull configuration for generating the large voltage swing for a low supply voltage. The arrangement of FIG. 3, however, disadvantageously exhibits a reduced tuning range and, as discussed above, an increased overall capacitance that dictates the use of a lower value inductor L to achieve a given LC constant.

The problem of parasitic capacitance is notably increased for high frequency VCO applications of 1 GHz and above, in which the integrated larger inductor L results in a larger R and, therefore, necessitates the use of larger transistors for a given supply voltage to generate a larger transconductance element (-R). The use of larger transistors, in turn, results in a higher parasitic capacitance.

SUMMARY OF THE INVENTION

The present invention relates to a voltage controlled oscillator CMOS circuit having a reduced overall capacitance value so that a large inductance for a given LC value can be used, thus rendering the inventive circuit with high quality and operable at high frequencies. The inventive circuit employs a first pair of CMOS transistors, each having source, gate, drain and back gate terminals, with a tunable voltage applied to the back gate terminals for varying the parasitic capacitance of the transistor pair. The transistors are arranged so that the gate terminal of each transistor is tied to the drain terminal of the other transistor and the transistor drain terminals are connected to each other across an inductance L. A current generating means, such as a current source or a second transistor pair having a similar configuration but of opposite polarity to the first transistor pair (e.g. either n-channel or p-channel) is also connected across the inductor for providing proper operating conditions for the circuit. The inventive circuit utilizes the back gate terminals of the first transistor pair to vary the parasitic capacitance, which results in the first transistor pair being employed as a substitute for a varactor, yielding the benefit of a reduced overall capacitance value with a large tuning range. Moreover, the first and/or second transistor pairs contribute to a transconductance value that reduces or cancels out the inherent resistance in the tank circuit, thereby allowing for sustained oscillation.

In a preferred embodiment, both the first and the second pair of transistors are employed, with a variable voltage signal applied to the back gate terminals of either the first pair or the second pair. In this preferred configuration, both pairs of transistors contribute to the transconductance effect and thereby compensate and cancel out a greater amount of the inherent resistance of the tank.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 1A:
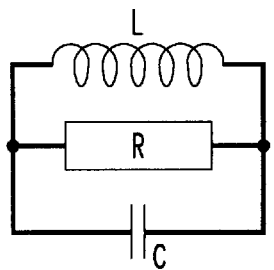
FIG. 1a is a schematic representation of a practical LC tank circuit.
Figure 1B:
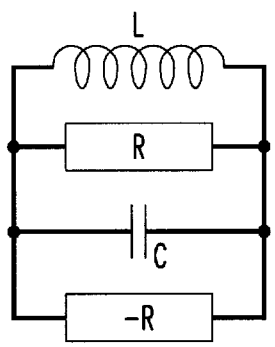
FIGS. 1b and 1c are schematic representations of a practical tank circuit with a "negative resistance" (-R) element.
Figure 1C:
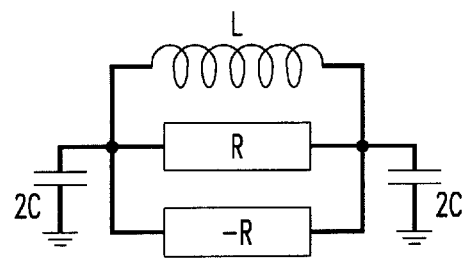
Figure 1D:
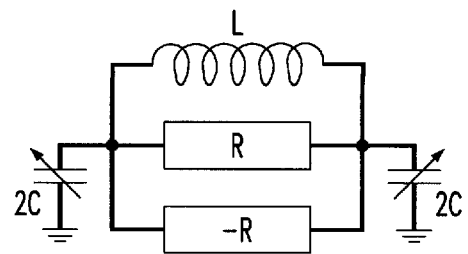
FIG. 1d is a schematic representation of the tank circuit of FIG. 1c with varactors substituted for capacitors.
Figure 2A:
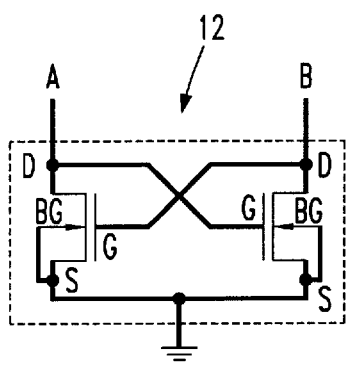
FIGS. 2a and 2b are alternative schematic representations of a CMOS transistor pair for producing a transconductance value for use as a negative resistance with an LC tank circuit.
Figure 2B:
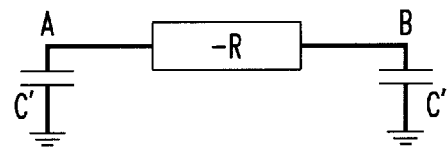
Figure 3:
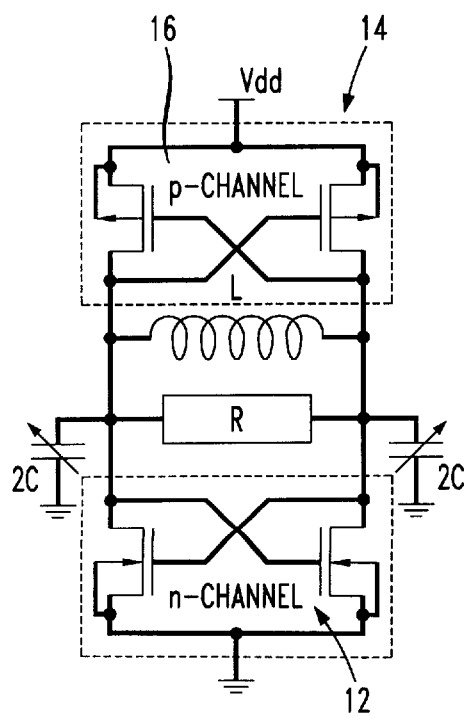
FIG. 3 is an LC tank circuit incorporating two CMOS transistor pairs configured as shown in FIGS. 2a and 2b.
Figure 4A:
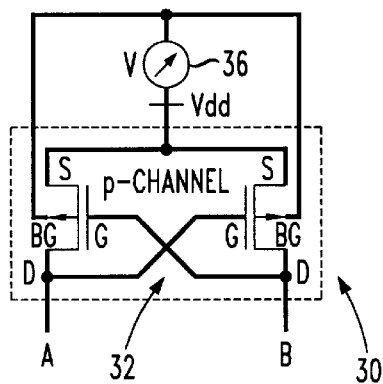
FIGS. 4a and 4b are alternative schematic representations of a CMOS transistor pair having a tunable voltage applied to back gate terminals of the transistor pair.

FIG. 4a depicts a preferred CMOS transistor circuit 30 constructed in accordance with the present invention. Circuit 30 includes a pair of CMOS transistors 32, each having source, drain, gate and back gate terminals. The transistors are arranged so that the gate terminal of one is connected to the drain terminal of the other, and vice versa. The source terminals are maintained at a constant voltage $V_{dd}$ and the back gate terminals are connected to a variable voltage source (V), designated as 36.

Figure 4B:
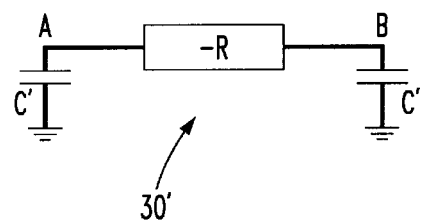

As is known in the art and described above, each transistor in transistor pair 32 has a parasitic capacitance value and functions as a transconductance element. Also as known in the art, the parasitic capacitance of a CMOS transistor varies as a function of the voltage applied to the transistor back gate terminal. Thus, by applying a variable voltage V to the back gate terminals of transistor pair 32, circuit 30 can be represented in the simplified form shown in FIG. 4b, with each transistor in pair 32 incorporating a varactor substitute (C') and contributing to a shared transconductance element (-R).

Figure 5:
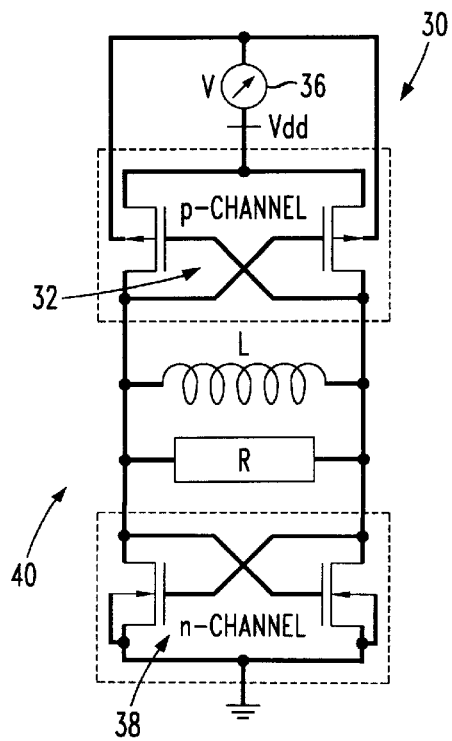
FIG. 5 is a schematic depiction of a tunable LC tank circuit constructed in accordance with the present invention.

Recognizing these properties of circuit 30, an LC tank circuit can be formed in accordance with the invention wherein one or more transistor pairs 32 are placed across an inductor L, as for example shown in FIG. 5. The transistor pairs contribute to generate transconductance which cancels out or over compensates for the inherent resistance R (shown in phantom in FIG. 5) from the tank circuit. Moreover, the circuit 40 can be tuned by varying the parasitic capacitance of the transistor pairs, as by adjusting the voltage V.

More particularly, and with continued reference to FIG. 5, a preferred VCO circuit 40 includes two pairs of transistors, namely pair 32 of p-channel devices and transistor pair 38 of n-channel devices. Each pair of transistors is connected across the terminals of inductor L. The transistor pairs operate in a push-pull manner. By arranging the transistor pairs in the manner shown in FIG. 5, both pairs contribute to the transconductance value, thus increasing the transconductance value and allowing low Q inductors—with larger inherent resistances—to be used for operation. This, in turn, enables the inventive circuit to be tuneable over wide frequency ranges and at high frequencies of 5 GHz and above while providing robust oscillation.

Figure 6A:
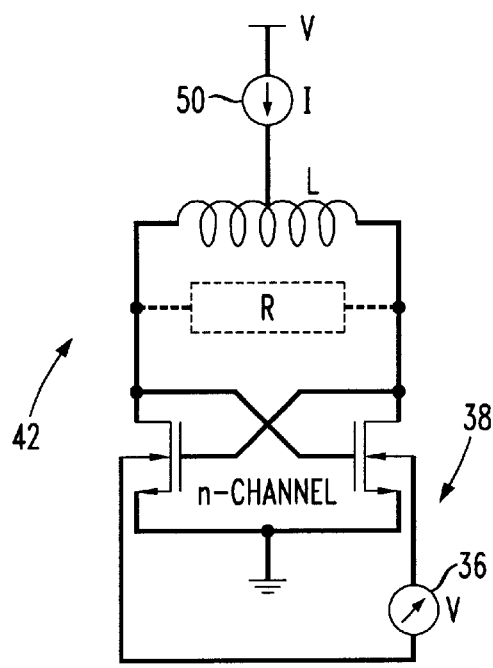
FIGS. 6a and 6b are schematic illustrations of LC tank circuits constructed in accordance with an alternate embodiment of the invention.
Figure 6B:
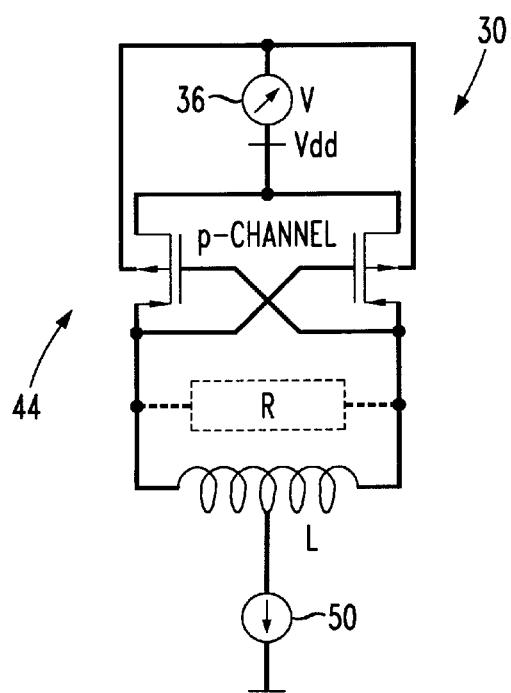

FIGS. 6a and 6b depict alternative embodiments 42, 44, respectively, of the present invention. The circuits 42, 44 operate in a similar manner to the VCO circuit 40 of FIG. 5. In FIG. 6a, circuit 42 employs a single pair of transistors 38 in conjunction with a constant current source 50. Variable voltage source 36 is connected to the back gate terminals of transistor pair 38. Although at present the majority of CMOS construction utilizes p-doped substrates, thus making it difficult to isolate the back gate terminals of N-channel devices so that a voltage 36 can be applied thereto, those having ordinary skill in the art will readily envision the ability to manufacture N-channel devices having isolated back gate terminals, such for example as by forming an insulation layer between the substrate and a well region.

Circuit 44 of FIG. 6b is similar to circuit 42 of FIG. 6a except that the more common p-channel transistors are employed. In each of circuit 42 or 44 the current source 50 functions as a replacement for a second transistor pair, such as the second pair 30 or 38 of FIG. 5. It should, however, be pointed out that inasmuch as only a single pair of transistors is used in each of the circuits 42 and 44, there are fewer transistors to contribute to the transconductance value; as a consequence less inductor resistance will be cancelled out in the alternative arrangements. Moreover, although the presently preferred embodiment is described as including at least one pair of CMOS transistors, as shown in FIG. 4a, the invention is also operable if a single transistor is used. It should be apparent, however, that a single transistor will generate less transconductance than a transistor pair.

Figure 7A:
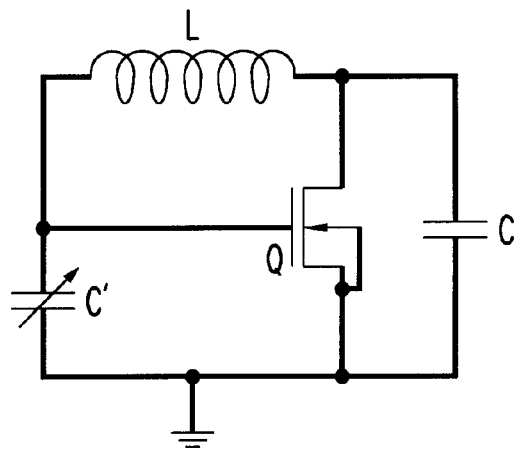
FIG. 7a is a schematic representation of a practical Colpitts oscillator.
Figure 7B:
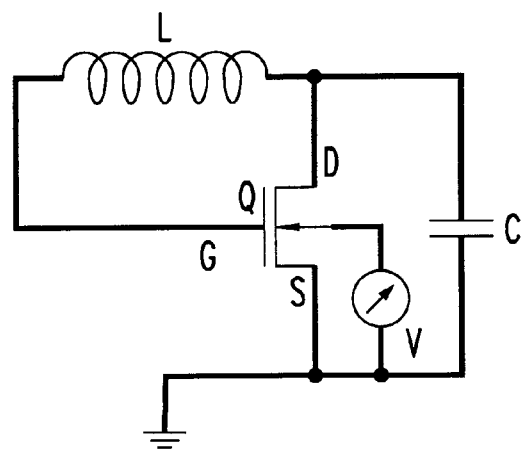
FIG. 7b is a schematic representation of a Colpitts oscillator in accordance with another embodiment of the present invention.

As should be readily apparent from the foregoing, the present invention provides for the use of a back-gate driven transistor for simultaneously generating transconductance and variable capacitance. Such a simultaneous function has many practical uses other than in a VCO circuit. For example, a Colpitts oscillator shown in FIG. 7b can be constructed as a substitute for the prior art practical Colpitts oscillator depicted in FIG. 7a. The Colpitts oscillator of FIG. 7a, consisting of a transistor Q, a capacitor C, an inductor L and a variable capacitance or varactor C' can be designed as the circuit in FIG. 7b wherein the variable capacitance function of the varactor C' is performed by a variable voltage V applied to the back gate terminal of transistor Q in FIG. 7b. Of course, the transistor Q will generate a transconductance value to offset a resistance inherent in the inductor L and capacitor C.

While there have thus been shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. It is the intention, therefore, to be limited only as indicated by the scope of the claims appended hereto.

I claim:

1. A voltage controlled oscillator CMOS circuit for high frequency operation, comprising:

an inductor having an inherent resistance value;

a first pair of CMOS transistors connected across said inductor, each transistor having source, drain, gate and back gate terminals, said pair being configured so that the drain terminal of one transistor of the first pair is connected to the gate terminal of the other transistor of the first pair, and the drain terminal of said other transistor of the first pair is connected to the gate terminal of said one transistor of the first pair, said transistor pair having a first pair transconductance value for cancelling at least a portion of the inherent resistance value of the inductor and an adjustable parasitic capacitance value that is adjusted by applying a tunable voltage to said back gate terminals while a common voltage is applied to said source terminals, said tunable voltage causing variation in oscillation of said circuit; and means connected across said inductor for generating a current through said inductor.

2. The circuit of claim 1, wherein said means for generating a current comprises a current source, and wherein said first pair of CMOS transistors comprises p-channel transistors.

3. The circuit of claim 1, wherein said means for generating a current comprises a current source, and wherein said first pair of CMOS transistors comprises n-channel transistors.

4. The circuit of claim 1, wherein said means for generating a current comprises a second pair of CMOS transistors, each transistor in said second pair having source, drain, gate and back gate terminals, said second pair being configured so that the source terminal of one transistor of the second pair is connected to the gate terminal of the other transistor of the second pair and the source terminal of said other transistor of the second pair is connected to the gate terminal of said one transistor of the second pair, said second transistor pair having a second pair transconductance value for cancelling out at least a portion of the inductor inherent resistance value.

5. The circuit of claim 4, wherein said first pair of CMOS transistors comprises p-channel transistors, and wherein said second pair of CMOS transistors comprises n-channel transistors.

6. The circuit of claim 4, wherein said first pair of CMOS transistors comprises n-channel transistors, and wherein said second pair of CMOS transistors comprises p-channel transistors.

7. A voltage controlled oscillator CMOS circuit for high frequency operation, comprising:

a capacitor having an inherent resistance value;

an inductor having an inherent resistance value;

a transistor having source, drain, gate and back gate terminals, said drain and source terminals connected across said capacitor, and said gate and drain terminals connected across said inductor, said transistor having a transconductance value for cancelling at least a portion of the inherent resistance values of the inductor and capacitor and an adjustable parasitic capacitance value that is adjusted by applying a tunable voltage to said back gate terminal, said tunable voltage causing variation in oscillation of said circuit.

* * * * *